(12) United States Patent
Schmidt et al.

(10) Patent No.: US 9,579,989 B2
(45) Date of Patent: Feb. 28, 2017

(54) BATTERY ARRANGEMENT FOR A MOTOR VEHICLE

(71) Applicant: Audi AG, Ingolstadt (DE)

(72) Inventors: Jörg Schmidt, Ingolstadt (DE); Michael Hinterberger, Ingolstadt (DE); Reuf Avdic, Ingolstadt (DE); Erdal Acikgoez, Taufkirchen (DE); Diana Stöckert, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 14/371,928

(22) PCT Filed: Dec. 14, 2012

(86) PCT No.: PCT/EP2012/005164
§ 371 (c)(1),
(2) Date: Jul. 11, 2014

(87) PCT Pub. No.: WO2013/104393
PCT Pub. Date: Jul. 18, 2013

(65) Prior Publication Data
US 2015/0028669 A1    Jan. 29, 2015

(30) Foreign Application Priority Data

Jan. 13, 2012  (DE) .................. 10 2012 000 585

(51) Int. Cl.
*H02J 7/00*       (2006.01)
*B60L 3/00*       (2006.01)
(Continued)

(52) U.S. Cl.
CPC .......... *B60L 11/1861* (2013.01); *B60L 3/0046* (2013.01); *B60L 11/1864* (2013.01);
(Continued)

(58) Field of Classification Search
USPC ...................................... 307/66, 9.1
See application file for complete search history.

(56) References Cited

U.S. PATENT DOCUMENTS 5,925,998 A * 7/1999 Olson ............................ 318/484
6,184,656 B1    2/2001 Karunasiri et al.
(Continued)

FOREIGN PATENT DOCUMENTS

CN        1284033 A      2/2001
DE       195 45 833      6/1997
(Continued)

OTHER PUBLICATIONS

International Search Report issued by the European Patent Office in International Application PCT/EP2012/005164.
(Continued)

*Primary Examiner* — Fritz M Fleming
*Assistant Examiner* — Dru Parries
(74) *Attorney, Agent, or Firm* — Henry M. Feiereisen LLC

(57) ABSTRACT

A battery arrangement for a motor vehicle, includes a plurality of battery modules, each of the battery modules having a plurality of battery cells and being coupled to a control unit, and a high voltage lead wire for electrical coupling being provided between all adjacent battery modules, the control units each being designed to exchange data via the high voltage lead wire.

6 Claims, 1 Drawing Sheet

(51) Int. Cl.
*B60L 11/18* (2006.01)
*H01M 10/48* (2006.01)
*H04Q 9/00* (2006.01)
*G01R 31/02* (2006.01)
*G01R 31/36* (2006.01)
*H01M 2/20* (2006.01)
*H01M 10/42* (2006.01)
*G01R 31/04* (2006.01)

(52) U.S. Cl.
CPC ........ *G01R 31/026* (2013.01); *H01M 10/482* (2013.01); *H04Q 9/00* (2013.01); *B60L 2240/547* (2013.01); *G01R 31/04* (2013.01); *G01R 31/362* (2013.01); *G01R 31/3658* (2013.01); *G01R 31/3689* (2013.01); *H01M 2/20* (2013.01); *H01M 10/4257* (2013.01); *H01M 2010/4271* (2013.01); *H01M 2220/20* (2013.01); *H04Q 2209/30* (2013.01); *Y02T 10/7005* (2013.01); *Y02T 10/7061* (2013.01)

(56) References Cited

U.S. PATENT DOCUMENTS 7,800,345 B2 * 9/2010 Yun .................. G01R 31/3675
320/132

| | | |
|---|---|---|
| 2002/0193955 A1 | 12/2002 | Bertness et al. |
| 2008/0192800 A1 | 8/2008 | Asada |
| 2010/0052428 A1 | 3/2010 | Imamura et al. |
| 2010/0259221 A1 | 10/2010 | Tabatowski-Bush |
| 2010/0291427 A1 * | 11/2010 | Zhou ...................... B60L 11/14 |
| | | 429/100 |
| 2011/0156650 A1 * | 6/2011 | Yang et al. .................. 320/118 |

FOREIGN PATENT DOCUMENTS

| | | |
|---|---|---|
| DE | 198 10 746 | 9/1999 |
| DE | 103 37 243 | 4/2004 |
| DE | 10 2008 006 542 | 9/2008 |
| DE | 10 2008 058 924 | 6/2009 |
| DE | 10 2010 016 175 | 8/2011 |
| FR | 2 589 008 | 4/1987 |

OTHER PUBLICATIONS

Chinese Search Report issued on Oct. 27, 2015 with respect to counterpart Chinese patent application 201280066382.7.

Translation of Chinese Search Report issued on Oct. 27, 2015 with respect to counterpart Chinese patent application 201280066382.7.

* cited by examiner

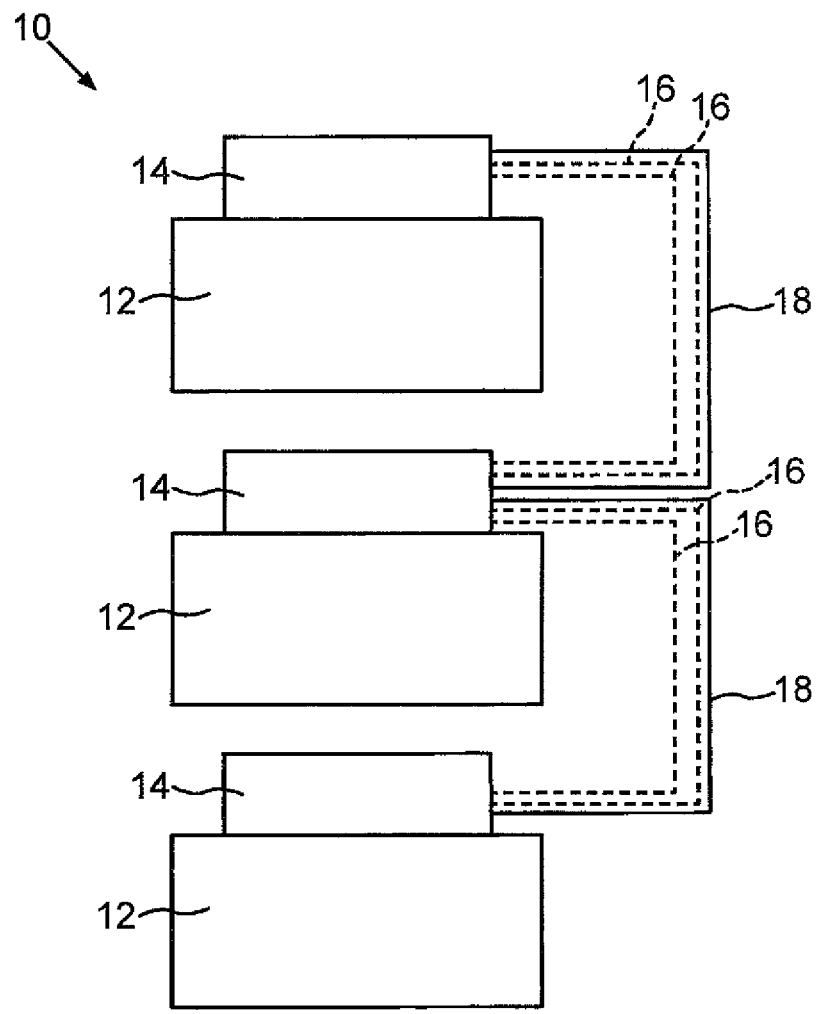

BATTERY ARRANGEMENT FOR A MOTOR VEHICLE

CROSS-REFERENCES TO RELATED APPLICATIONS

This application is the U.S. National Stage of International Application No. PCT/EP2012/005164, filed Dec. 14, 2012, which designated the United States and has been published as International Publication No. WO 2013/104393 A1 and which claims the priority of German Patent Application, Serial No. 10 2012 000 585.7, filed Jan. 13, 2012, pursuant to 35 U.S.C. 119(a)-(d).

BACKGROUND OF THE INVENTION

The present invention relates to the battery arrangement for a motor vehicle with a plurality of battery modules. The present invention also relates to a motor vehicle. Finally the present invention relates to a method for testing an electrical connection between at least two battery modules of a battery arrangement for a motor vehicle.

In motor vehicles battery arrangements are used for the electrical supply of operating components of the motor vehicle. In particular in electric vehicles traction batteries are used which include multiple battery modules connected in series in order to achieve a correspondingly high overall voltage so that the required power can be transmitted. These battery modules can include a plurality of battery cells or individual cells which can for example be made of lithium ion cells or cells with other cells for example a nickel metal hybrid accumulator (NiMH). Usually the battery cells are monitored by a higher level monitoring device or a battery management system. Hereby a measuring line or sensor line is guided from each of the battery cells into the battery management. These measuring lines also enabling recognizing during the assembly of such a battery arrangement the electrical voltage that has already been achieved in the overall system. By taking targeted influence on the mounting order it is also possible to achieve a dangerous voltage for example a DC voltage over 60 V as late as possible.

The approach for modularization of such a battery arrangement is also known. Hereby it is sought to keep the analysis of the cell voltages on the modular level. The individual battery modules communicate their measuring values then via the corresponding bus system (e.g. CAN-bus) to a higher level battery management system. Hereby the individual battery module are each coupled with a corresponding control unit. This control unit knows the electrical connection and the electrical voltage provided by the battery module and provides this information to the higher level monitoring device for the higher level battery management system. No information regarding the connection of the modules to each other is available to the respective control units of the battery modules. Similarly the information regarding the electrical voltage provided by the battery arrangement are available in the higher level battery management system only after assembly of the battery arrangement. As a consequence the electrical voltage, which is present at the battery arrangement cannot be traced during the assembly of the battery arrangement. This also does not allow determining a possible risk during assembly of the battery arrangement.

DE 198 10 746 B4 describes a circuit board with a circuit for monitoring a multi cellular accumulator battery, with which the electrical voltage and the temperature of the individual cells in the battery can be detected. The circuit board also has inputs and outputs which are connected to a data bus which connects the battery with further batteries and a central battery management system.

Further methods is known from DE 10 2008 058 924 B4 for identifying and quality documentation of accumulators for industrial tools. Hereby the data of the accumulator such as its serial number are stored in a corresponding component. These data can be modulated onto to the current line which is assigned to the accumulator.

DE 10 2010 016 175 A1 describes a device for monitoring and controlling a battery wherein each battery cell in the battery is assigned a battery monitoring module. The device also includes a system controller, which is configured to monitor the battery modules, to retrieve data from the battery modules and to execute commands for controlling the charge compensation.

A battery with multiple individual cells, which are connected in series and which are connected to each other via a common current line for charging the individual cells is described in DE 195 45 833 B4. Hereby each individual cell of the battery is assigned an individual cells module, which has the capability to receive and execute individual charge signals. The individual charge signals are outputted by a central unit via the current line, which can be configured as modulated field bus.

In addition DE 103 37 243 A1 discloses a battery testing module for accumulator batteries in which a plurality of battery cells are connected in series in a battery housing. With the battery testing module information relating to the properties of the battery can be provided. The battery testing module is configured to receive and transmit data such as the serial number of the battery. These data can also be provided to the positive and negative connections of the battery.

Finally U.S. Pat. No. 6,184,656 B1 describes a battery arrangement with a plurality of battery modules, which can each include multiple battery cells. Hereby each battery module is assigned a control unit. Each of the control units is configured to send data and to receive data from other control units via the electrical connecting lines with which the individual battery modules are electrically connected. With the control units data can also be sent to a higher level monitoring device.

SUMMARY OF THE INVENTION

It is an object of the present invention to provide an approach how to simply and safely assemble a battery arrangement for a motor vehicle which includes a plurality of battery modules.

According to the invention this object is solved by a battery arrangement including a plurality of battery modules, each battery module comprising a plurality of battery cells; control units, each battery module being coupled with a respective one of the control units, a high voltage line provided between respectively adjacent ones of the battery modules for electric coupling, wherein the control units are respectively configured to exchange data via the high voltage line and to send the data received via the respective high voltage line to a higher level monitoring device; and a measuring device configured to determine the presence of an electrical connection between at least two of the battery modules via the high voltage line and to output a warning signal when the electric voltage provided by the electric connection between the at least two battery modules exceeds a predetermined threshold value, by a motor vehicle including the battery arrangement according to the invention and by a method for testing an electric connection between at least two battery modules of a battery arrangement for a motor vehicle including providing the battery modules, wherein each of the battery modules has a plurality of battery cells and each battery module is coupled with a respective control unit; electrically coupling of at least two adjacent battery modules with a high voltage line; sending data with each of the control units, wherein the control units are configured to transmit the data via the high voltage line; testing an electrical connection between at least two of the battery modules by way of the data which are received by the control units from the other control units, and outputting a warning signal when the electric voltage provided by the connection of the at least two battery modules exceeds a predetermined threshold value. Advantageous refinements of the present invention are set forth in the dependent claims.

The battery arrangement according to the invention for a motor vehicle includes a plurality of battery modules, wherein each of the battery modules includes a plurality of battery cells, is coupled with a respective control unit, and a high voltage line is provided between respectively adjacent battery modules for electric coupling, wherein the control units are each configured to exchange data via the high voltage line. The battery arrangement is for example used as traction battery in a motor vehicle. The battery arrangement includes a plurality of battery modules, which are electrically connected in series in order to provide the required electrical power in the motor vehicle in particular in an electric vehicle. Each of the battery modules includes a plurality of battery cells, which can be electrically connected in series. In the battery arrangement at least two adjacent battery modules can be electrically coupled or connected with a high voltage line. Each of the battery cells is coupled with a control unit with which usually the electrical voltages of the battery cells in the battery module can be monitored. The control units are additionally configured to exchange data via the high voltage line. When for example two battery modules are electrically connected with the high voltage line the data can be exchanged between the control units which are respectively coupled with the adjacent battery modules. Each of the control units is configured to send data via the high voltage line and to receive data sent by the other control units via the high voltage line. This thus allows in a simple manner to exchange data between the control units of electrically connected battery module data, without requiring an additional data line for this purpose.

In addition the battery arrangement includes a measuring device with which the presence of an electrical connection between at least two of the battery modules via the high voltage line can be determined by way of the data which are sent to the monitoring device. The data which are present at the monitoring device contain information whether the control units respectively have received data from the other control units. The control units can only receive data from the other control units when the battery modules with which the respective control units are coupled are electrically connected via the high voltage line. This information allows determining which of the battery modules are electrically interconnected. Thus this allows also to draw conclusions regarding the electrical voltage which is present in the battery arrangement by the serial connection of the individual battery modules. This enables constantly monitoring during the assembly of the battery arrangement which voltage currently lies on the battery arrangement.

Further a warning signal can be outputted with the measuring device in the case the electrical overall voltage which is provided by the electrical connection between the at least two battery modules at the high voltage line exceeds a predetermined threshold value. Thus the measuring device can for example output a signal in the case the electrical voltage in the battery arrangement exceeds a DC voltage of 60 V. As a result corresponding safety measures can be taken or corresponding safety clothing can be provided. Thus a particularly safe assembly of the battery arrangement for a motor vehicle in particular a motor vehicle is possible.

Preferably each of the control units is configured to send data which contains an identification of the battery module with which it is coupled. Such an identification can for example be a corresponding identification number of the respective battery module. In addition the control units are configured to receive data form the other control units, which respectively contains an identification of the battery module with which the respective control unit is coupled. When the battery modules are interconnected via the high voltage lone data can also be transmitted via the high voltage line. Thus a communication between the individual battery modules can be made possible in a simple manner.

In an embodiment the control units modulate for exchanging the data a voltage which is generated by at least one battery module at the high voltage line. A corresponding signal which contains an identification is modulated onto the high voltage line with which at least two battery modules are connected in series. This can for example occur by a pulse width modification of the electrical voltage or the voltage signal which is transmitted via the high voltage line. For this purpose the control units each contain corresponding electronics enabling the modulation of the voltage signal.

In an embodiment each of the control units is electrically connected with the high voltage line via a measuring line for exchanging the date, wherein the control unit detects at the measuring line an electrical voltage of at least one battery cell of the battery module with which it is coupled. The battery cells or individual cells in each battery module are respectively connected with the control unit via a corresponding measuring line or sensor line. Thus the control unit can monitor the electric voltage at the individual cells. Preferably the measuring lines, which are arranged in battery cells on the two ends of the battery module, are connected with the high voltage line when the high voltage line is electrically connected to the respective battery module. Thus the control unit can in a simple manner transmit a modulated signal to the high voltage line via the measuring line. In addition a corresponding signal can be transmitted to the control unit via this measuring line from the high voltage line.

In an embodiment each of the control units is configured to send the data respectively received via the high voltage line to a higher level monitoring device via a data bus. The control units of the battery modules in the battery arrangement are all connected with an higher level monitoring device or the battery management system via a data bus, in particular the CAN bus. Thus information is present in the higher level battery management system which has received control unit data from the other control units. A corresponding data bus and a higher level monitoring device are usually present in electric vehicles thus not creating additional costs.

The motor vehicle according to the invention includes the battery arrangement described before. In particular the motor vehicle is an electric vehicle in which the battery arrangement is used as traction battery.

The method according to the invention for testing an electrical connection between at least two battery modules of a battery arrangement for a motor vehicle includes providing the battery modules, wherein each of the battery modules includes a plurality of battery cells and each battery module is coupled with a respective control unit, and electrically connecting at least two adjacent battery modules with a respective high voltage line, sending data with each of the control units, wherein the control units are configured to transmit data via the high voltage line, monitoring of an electrical connection between at least two battery modules by way of the data received by the control units respectively from the other control units, and outputting of a warning signal when the voltage provided by the electrical connection between the at least two battery modules exceeds a predetermined threshold value.

The advantages previously described in connection with the battery arrangement according to the invention and refinements can be applied in the same manner to the motor vehicle according to the invention and the method according to the invention.

BRIEF DESCRIPTION OF THE DRAWING

In the following, the present invention is explained in more detail by way of the included drawings. The sole FIGURE shows a schematic representation of a battery arrangement for a motor vehicle.

DETAILED DESCRIPTION OF PREFERRED EMBODIMENTS

The exemplary embodiment shown in the following in more detail represents a preferred embodiment of the present invention.

The FIGURE shows a schematic representation of a battery arrangement 10. This battery arrangement 10 can be used in a motor vehicle, in particular in an electric vehicle. In particular the battery arrangement 10 can be used as traction battery. Such a battery arrangement 10 usually includes a plurality of battery modules 12 and in the FIGURE a battery arrangement 10 is shown which includes three battery modules 12.

Each of the battery modules includes a plurality of battery cells which are not further shown in the FIGURE. These battery cells can be lithium ion cells or cells with a different chemistry. The batteries in the battery modules 12 are usually electrically connected in series. In particular the battery module 12 includes the same number of battery cells or individual cells.

Each of the battery modules 12 is coupled with a control unit 14. Each of the battery cells of a battery module 12 can be connected with a corresponding measuring line, which in turn is electrically connected with the respective control unit 14. Thus the control unit 14 can for example monitor the electric voltage of the individual battery cells in the battery module 12. The individual control units 14 of the battery modules 12 are connected with each other by a data line 16. This data line can for example be a CAN-bus. The individual control units 14 are connected via the data line 16 with a here not shown higher level monitoring device or the battery management system.

During assembly of the battery arrangement 10 respective adjacent battery modules 12 can be electrically connected with a high voltage line 18 in particular in series. As a result of the electrical serial connection of the individual battery modules 12 via the respective high voltage line 18 the electric voltage or power required in the motor vehicle can be provided.

The control units 14 are additionally configured to exchange data via the high voltage line 18. Each of the control units 14 can send data to the other control units and receive data sent by the other control units via the high voltage line 18. The data as they are sent by one of the control nits 14 contain preferably an identification of the battery module 12 with which the control unit 14 is coupled. The data exchange between two control units 14 is only enabled when the battery modules 12, which are assigned to the control units 14, are electrically interconnected via the high voltage line 18.

The higher level monitoring device with which each of the control units 14 is connected via a data bus 16, can receive corresponding data from each of the control units 14, which contain information regarding whether one of the control units 14 has received data from at least one further control unit 14 and from which of the control units 14 it has received data. this information stored on the higher level monitoring device or the battery management system can be analyzed in a not shown measuring device. Based on the information the measuring device can determine which of the control units 14 has respectively received data from the other control units 14.

Because the transmission of the data occurs via the high voltage line 18, the measuring device can determined based on this information which of the battery modules 12 are respectively electrically interconnected via the high voltage line 18. With this information and with the additional information what electrical voltage is provided by the respective battery module 12, the measuring device can determine the currently present electric voltage at the battery arrangement. In addition the measuring device can output a corresponding warning signal when the electric voltage in the battery arrangement 10 exceeds a predetermined threshold value. Thus a high safety can be ensured during assembly of the battery arrangement 10, which includes a plurality of battery module 12.

What is claimed is:

1. A battery arrangement for a motor vehicle, comprising:
a plurality of battery modules, each battery module comprising a plurality of battery cells;
control units, each battery module being coupled with a respective one of the control units;
a high voltage line provided between respectively adjacent ones of the battery modules for electric coupling, wherein the control units are respectively configured to exchange data via the high voltage line and to send the data received via the respective high voltage line to a higher level monitoring device; and
a measuring device configured to determine the presence of an electrical connection between at least two of the battery modules via the high voltage line and outputting a warning signal during assembly of the battery arrangement in the vehicle when a cumulative electric voltage provided by the at least two battery modules in a connected state of the at least two battery modules exceeds a predetermined threshold value said warning signal being perceptible by a person assembling the battery arrangement.

2. The battery arrangement of claim 1, wherein each of the control units is configured to send data which contain an identification of the battery module with which it is coupled.

3. The battery arrangement of claim 1, wherein the control units for exchanging the data modulate a voltage generated by at least one battery module at the high voltage line.

4. The battery arrangement of claim 1, wherein each control unit for exchanging the data is electrically connected with the high voltage line, wherein the control unit detects an electric voltage at the measuring line of at least one battery cell of the battery module with which it is coupled.

5. A motor vehicle, comprising the battery arrangement of claim 1.

6. A method for testing an electric connection between at least two battery modules of a battery arrangement for a motor vehicle comprising:
- providing the battery modules, wherein each of the battery modules has a plurality of battery cells and each battery module is coupled with a respective control unit;
- electrically coupling of at least two adjacent battery modules with a high voltage line;
- sending data with each of the control units, wherein the control units are configured to transmit the data via the high voltage line;
- testing during assembly of the battery arrangement in the vehicle an electrical connection between at least two of the battery modules by way of the data which are received by the control units from the other control units, and
- outputting during the assembly of the battery arrangement in the vehicle a warning signal when a cumulative electric voltage provided by the at least two battery modules in a connected state of the at least two battery modules exceeds a predetermined threshold value said warning signal being perceptible by a person assembling the battery arrangement.

* * * * *